(12) United States Patent
Tansley et al.

(10) Patent No.: US 7,570,114 B2
(45) Date of Patent: Aug. 4, 2009

(54) COMMON MODE REJECTION CALIBRATION METHOD FOR DIFFERENCE AMPLIFIERS

(75) Inventors: Tomas Tansley, Fenit (IE); Gavin Cosgrave, Enniscorthy (IE)

(73) Assignee: Analog Devices, Inc., Norwood, MA (US)

( * ) Notice: Subject to any disclaimer, the term of this patent is extended or adjusted under 35 U.S.C. 154(b) by 48 days.

(21) Appl. No.: 11/880,989

(22) Filed: Jul. 24, 2007

(65) Prior Publication Data

US 2009/0027125 A1    Jan. 29, 2009

(51) Int. Cl.
*H03F 3/45* (2006.01)
(52) U.S. Cl. ...................................... 330/258
(58) Field of Classification Search .......... 330/252–261
See application file for complete search history.

(56) References Cited

U.S. PATENT DOCUMENTS

| | | | |
|---|---|---|---|
| 6,380,807 B1 | 4/2002 | Brokaw | 330/258 |
| 6,617,838 B1 | 9/2003 | Miranda et al. | 324/117 R |
| 6,956,727 B1 | 10/2005 | Brokaw | 361/93.7 |
| 7,193,464 B2 * | 3/2007 | Wang et al. | 330/253 |

OTHER PUBLICATIONS

Ramón Pallás-Areny et al. ; "Common Mode Rejection Ratio in Differential Amplifiers"; IEEE Transactions on Instrumentation and Measurement; vol. 40, No. 4; Aug. 1991; pp. 669-676.

* cited by examiner

*Primary Examiner*—Robert Pascal
*Assistant Examiner*—Khiem D Nguyen
(74) *Attorney, Agent, or Firm*—Koppel, Patrick, Heybl & Dawson

(57) ABSTRACT

A common mode rejection calibration scheme for use with a difference amplifier having an associated signal path. A signal is generated which varies with the common mode voltage of the differential input voltage applied to the amplifier. This signal is scaled and coupled into the signal path such that the scaled signal reduces the common-mode error that would otherwise be present in the difference amplifier's output.

19 Claims, 7 Drawing Sheets

COMMON MODE REJECTION CALIBRATION METHOD FOR DIFFERENCE AMPLIFIERS

BACKGROUND OF THE INVENTION

1. Field of the Invention

This invention relates generally to difference amplifiers, and more particularly, to methods for improving the common mode rejection characteristic of such amplifiers.

2. Description of the Related Art

Difference amplifiers are typically employed to measure the magnitude of a differential voltage. One common application is that of a current sensing circuit. A shunt resistor having a resistance $R_{shunt}$ is connected to conduct a current of interest I, and the differential voltage $V_{shunt}$ that develops across the resistor is measured with a difference amplifier, with I given by $V_{shunt}/R$.

A conventional circuit arrangement for sensing a current is shown in FIG. 1. $R_{shunt}$ is connected between nodes IP and IN, and conducts current of interest I. A resistor having a resistance R1 is connected between node IP and the inverting input of an operational amplifier A1, a resistor having a resistance R2 is connected between the inverting input and the amplifier's output ($V_{out}$), a resistor having a resistance R3 is connected between node IN and the amplifier's non-inverting input, and a resistor having a resistance R4 is connected between the non-inverting input and the amplifier's output. When so arranged, $V_{out}$ varies with the difference between the voltage at IP ($V_{IP}$) and the voltage at IN ($V_{IN}$).

Ideally, $V_{out}$ varies only with difference voltage $V_{IP}-V_{IN}$. However, inaccuracies can arise in $V_{out}$ due to errors resulting from finite rejection of the common-mode voltage $$V_{cm}\left(=\frac{V_{IP}+V_{IN}}{2}\right)$$

present at nodes IP and IN. In the described current measurement application, $V_{cm}$ can be many times larger than the input voltage, necessitating a large common mode rejection ratio (CMRR). The CMRR for the circuit of FIG. 1 is given by $A_{dm}/A_{cm}$, where $A_{dm}$ is the circuit's differential gain, given by R2/R1, and $A_{cm}$ is the circuit's common-mode gain, which is ideally zero.

However, practically, $A_{cm}$ is never zero, and thus degrades common-mode rejection. As defined, for example, in Pallás-Areny et al., "Common Mode Rejection Ratio in Differential Amplifiers", IEEE Transactions on Instrumentation and Measurement", vol. 40, no. 4, August 1991, $A_{cm}$ is given by:

$$A_{cm} = \left[\frac{\frac{R1}{R1+R2} + \frac{R4}{R3+R4}}{\frac{R4}{R3+R4} - \frac{R4}{R2+R1}}\right] * \frac{R2}{R1} * \frac{1}{2}.$$

Thus, $A_{cm}$ is dominated by resistor mismatch, while the contributions due to the operational amplifier itself can be made negligible by careful design.

Many methods are employed to reduce $A_{cm}$. Typically, some sort of trimming is performed under a fixed set of conditions; for example, the resistors can be laser trimmed such that common-mode error is reduced. However, such trimming is costly, and is generally less effective when circuit conditions differ from those used during the trimming process.

SUMMARY OF THE INVENTION

A common mode rejection calibration scheme for difference amplifiers is presented which addresses the problems noted above, with effective common-mode error reduction provided over a range of common-mode input voltages.

The present common mode rejection calibration scheme is for use with a difference amplifier having an associated signal path. The calibration method requires generating a signal which varies with the common mode voltage ($V_{cm}$) of the applied differential voltage, scaling the generated signal, and coupling the scaled signal into the signal path such that the scaled signal reduces the common-mode error that would otherwise be present in the difference amplifier's output.

Because they are straightforward to add or subtract, the generated and scaled signals are typically currents, with the scaled current being coupled to one or more of the currents conducted by the differential transistor pair of the amplifier's input stage. The method can be used with amplifiers that are referenced to ground or to a negative supply voltage, as well as with amplifiers which are chopper-stabilized.

The method is preferably implemented with a voltage-to-current converter which produces a current ($I_{cm}$) that varies with $V_{cm}$, and a digital-to-analog converter (DAC) which receives current $I_{cm}$ at an input, scales $I_{cm}$ in response to a digital value applied at the DAC's digital input, and provides the scaled current ($I_{cm,s}$) at its analog output. Current $I_{cm,s}$ is coupled to at least one of the currents conducted by the differential transistor pair, with the coupling and scaling performed so as to reduce the common-mode error.

These and other features, aspects, and advantages of the present invention will become better understood with reference to the following drawings, description, and claims.

DETAILED DESCRIPTION OF THE INVENTION

Figure 1:
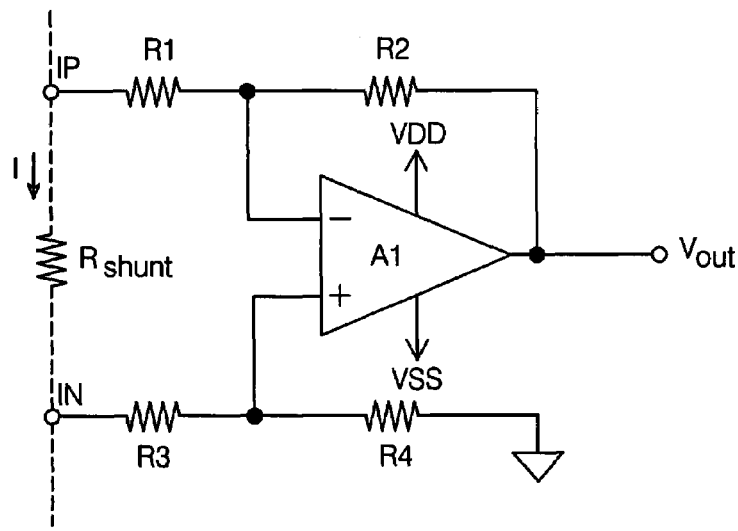
FIG. 1 is a schematic diagram of a known current sensing circuit which employs a difference amplifier.
Figure 2:
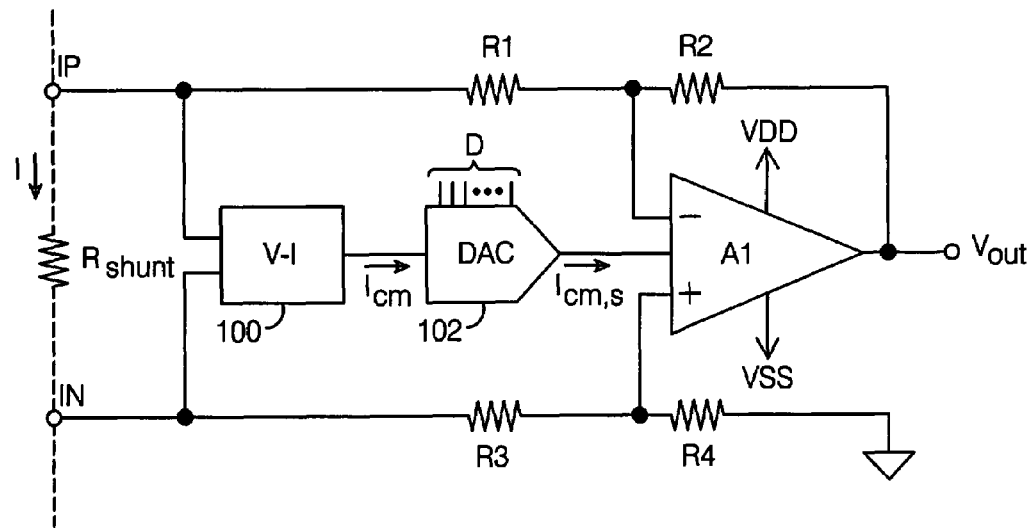
FIG. 2 is a block/schematic diagram illustrating the principles of a common mode rejection calibration scheme per the present invention.

A block/schematic diagram illustrating the principles of a common mode rejection calibration scheme per the present invention is shown in FIG. 2. As with a conventional difference amplifier circuit, a resistor having a resistance R1 is connected between an input node IP and the inverting input of an operational amplifier A1, a resistor having a resistance R2 is connected between the inverting input and the amplifier's output ($V_{out}$), a resistor having a resistance R3 is connected between an input node IN and the amplifier's non-inverting input, and a resistor having a resistance R4 is connected between the non-inverting input and the amplifier's output. When so arranged, $V_{out}$ varies with the difference between the voltage at IP ($V_{IP}$) and the voltage at IN ($V_{IN}$). This arrangement can be used to measure differential voltages between IP and IN generally, and is particularly well-suited for measuring the voltage across a shunt resistor having a resistance $R_{shunt}$ in order to determine the magnitude of a current I flowing through $R_{shunt}$. The common-mode voltage ($V_{cm}$) at nodes IP and IN is given by $V_{cm} = (V_{IP} + V_{IN})/2$.

Ideally, R1=R3 and R2=R4, and the gain of the amplifier circuit is equal to the differential gain $A_{dm}$ given by $-R2/R1$. However, as noted above, a common-mode error can appear in $V_{out}$, largely as a result of mismatches between resistances R1 and R3, and/or R2 and R4.

The present common mode rejection calibration scheme reduces this common-mode error. This is accomplished by coupling a signal which varies with $V_{cm}$ into the amplifier's signal path such that it cancels out the common-mode error. This compensation signal can be a voltage or a current, though a current is preferred as currents are easily added to the signal path of an operational amplifier. For purposes of illustration, the generation of a compensation current is discussed herein.

A compensation current is generated by first generating a current ($I_{cm}$) which varies with $V_{cm}$, scaling $I_{cm}$, and coupling the scaled current ($I_{cm,s}$) into the amplifier's signal path by means of the differential transistor pair making up the input stage of A1, such that the common-mode error that would otherwise be present in A1's output is reduced.

Rearranging the expression for $A_{cm}$ shown above to obtain an expression for the common-mode error component ($V_{cmout}$) present in the output ($V_{out}$) of A1:

$$V_{cmout} = \frac{V_{IP}+V_{IN}}{2} * \left[\frac{\frac{R1}{R1+R2}+\frac{R4}{R3+R4}}{\frac{R4}{R3+R4}-\frac{R4}{R2+R1}}\right] * \frac{R2}{R1} * \frac{1}{2},$$

where $V_{IP}$ and $V_{IN}$ are the voltages at input nodes IP and IN, respectively. To reduce this error, the present common mode rejection calibration system adds a current ($I_{cm,s}$) to the signal path to compensate for $V_{cmout}$. Assuming $I_{cm,s}$ is coupled to an appropriate point in the signal path, the value of $I_{cm,s}$ needed to compensate for $V_{cmout}$ is given by:

$$I_{cm,s} = -\frac{\frac{V_{IP}+V_{IN}}{2} * \left[\frac{\frac{R1}{R1+R2}+\frac{R4}{R3+R4}}{\frac{R4}{R3+R4}-\frac{R4}{R2+R1}}\right] * \frac{R2}{R1} * \frac{1}{2}}{gm},$$

where gm is the transconductance of the differential transistor pair making up the input stage of the operational amplifier. The amplifier is preferably designed such that gm is reasonably constant over temperature.

FIG. 2 shows one means by which scaled current $I_{cm,s}$ might be generated. A voltage-to-current (V-I) converter 100 is connected to receive voltages $V_{IP}$ and $V_{IN}$ and to produce a current $I_{cm}$ which varies with the common-mode voltage $$\frac{V_{IP}+V_{IN}}{2}.$$

This current is applied to the reference input of a digital-to-analog converter (DAC) 102, which also receives a digital value D at its digital inputs. DAC 102 is arranged to scale current $I_{cm}$ in response to digital value D, and to provide the scaled current ($I_{cm,s}$) at its analog output. Scaled current $I_{cm,s}$ is coupled to the differential transistor pair making up the input stage of amplifier A1, so as to mismatch their respective currents and thereby reduce the common-mode error. Since scaled current $I_{cm,s}$ varies with the common-mode voltage at IP and IN, the error reduction can remain effective over a range of common-mode voltages.

Note that scaling could also be accomplished by varying the values of R5, R6, and/or R7. In this case, DAC 102 could be eliminated, such that the voltage-to-current converter and the scaling circuit are the same circuit, and current $I_{cm}$ becomes the scaled current.

In FIG. 2, operational amplifier A1 is shown as powered by supply voltages VDD and VSS. Note, however, that the present common mode rejection calibration scheme can also be employed with a ground-referenced difference amplifier; this is discussed in more detail below. Also note that it is not essential that the difference amplifier circuit include four external resistors as shown FIG. 2; the present invention can be used to reduce the common-mode error associated with any difference amplifier circuit, as long as a means is provided whereby scaled current $I_{cm,s}$ can be coupled into the amplifier's signal path.

Figure 3:
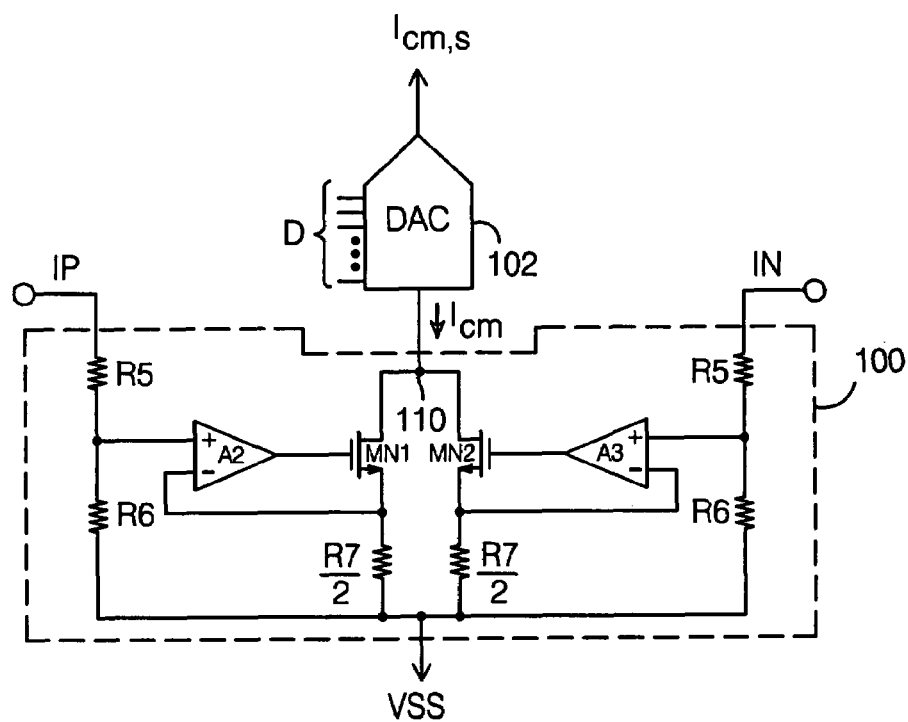
FIG. 3 is a block/schematic diagram of a voltage-to-current converter as might be used with a common mode rejection calibration scheme per the present invention.

One possible implementation of V-I converter 100 is shown in FIG. 3. Input nodes IP and IN are connected to respective voltage dividers, each comprising resistors having resistances R5 and R6. The output of each divider is connected to a buffer amplifier (A2, A3), the output of which drives a transistor (MN1, MN2) having a resistance R7/2 connected between its source and negative supply voltage VSS. Thus, MN1 conducts a current that varies with $V_{IP}$ and MN2 conducts a current that varies with $V_{IN}$; these currents are summed at a node 110 to form current $I_{cm}$. Current $I_{cm}$ is then applied the reference input of DAC 102, which scales $I_{cm}$ and generates current $I_{cm,s}$.

V-I converter 100 is preferably referenced to VSS, to allow processing of the common mode input signal from a voltage a little above VSS to above VDD. The ratio of R5 and R6 is preferably set to attenuate the input signal so as to minimize the common mode input range of amplifiers A2 and A3.

When implemented as shown in FIG. 3, the expression for $I_{cm,s}$ is given by:

$$I_{cm,s} = \left[ \begin{array}{c} (V_{IP} - VSS) * \frac{R6}{R5 + R6} * \frac{2}{R7} + \\ (V_{IN} - VSS) * \frac{R6}{R5 + R6} * \frac{2}{R7} \end{array} \right] * SF_{cm,s},$$

where $SF_{cm,s}$ is the scaling factor imposed by DAC 102. This reduces to:

$$I_{cm,s} = \left[ \left( \frac{(V_{IP} + V_{IN})}{2} - VSS \right) * \frac{R6}{R5 + R6} * \frac{1}{R7} \right] * SF_{cm,s}.$$

Figure 4:
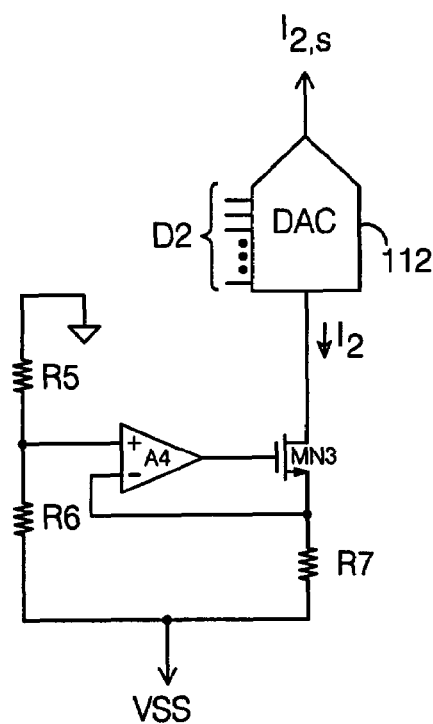
FIG. 4 is a block/schematic diagram of a scalable current generating circuit as might be used with a common mode rejection calibration scheme per the present invention.

In FIG. 3, current $I_{cm,s}$ is generated with respect to VSS, and thus should be able to reduce the common-mode error of a single supply, VSS-referenced difference amplifier. Commonly, however, difference amplifiers use bipolar supplies and are referenced to ground. In this case, an additional current may be needed to remove the VSS term in the equations above, and to reduce the common-mode error. One possible circuit for generating the additional current is shown in FIG. 4. Resistance R5 and R6 again form a voltage divider, this time between ground and VSS. The output of the divider is connected to a buffer amplifier A4, the output of which drives a transistor MN3 having a resistance R7 connected between its source and VSS. Thus, MN3 conducts a fixed current $I_2$. Current $I_2$ is then applied to the reference input of a DAC 112, which scales $I_2$ in response to a digital value D2 to generate current $I_{2,s}$.

When arranged as shown in FIG. 4, current $I_{2,s}$ is given by:

$$I_{2,s} = \left[ (0 - VSS) * \frac{R6}{R5 + R6} * \frac{1}{R7} \right] * SF_2,$$

where $SF_2$ is the scaling factor imposed by DAC 112. To completely remove the VSS term from the transfer function, the scaling factors imposed by DACs 102 and 112 should match.

Subtracting $I_{2,s}$ from $I_{cm,s}$ results in a term proportional to the input common-mode voltage, but independent of VSS:

$$I_{cm,s} - I_2 = \left[ \frac{(V_{IP} + V_{IN})}{2} * \frac{R6}{R5 + R6} * \frac{1}{R7} \right] * SF$$

where $SF_{cm,s} = SF_2 = SF$.

Figure 5A:
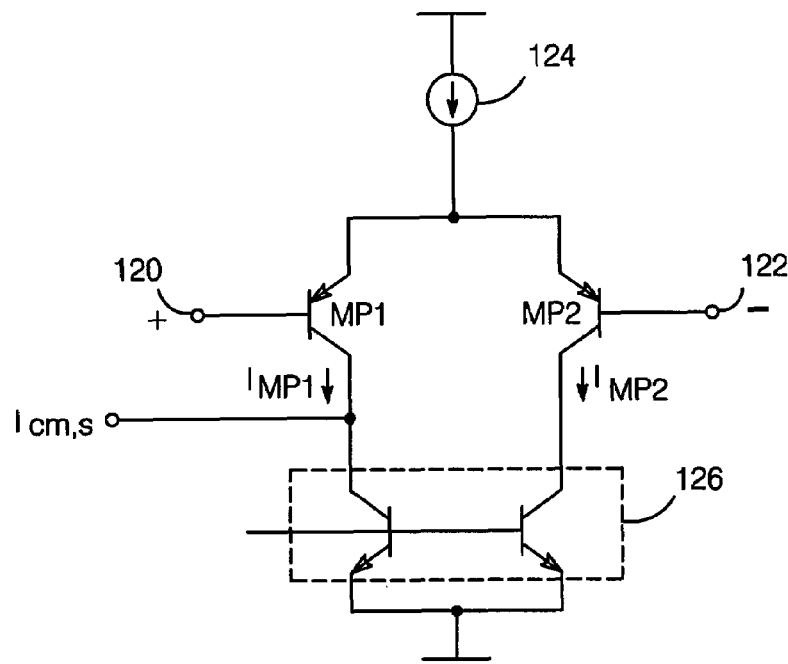
FIG. 5a is a schematic diagram illustrating one possible way in which a compensation current as generated by a common mode rejection calibration scheme per the present invention could be coupled to an operational amplifier.

To reduce common-mode error, current $I_{cm,s}$ is coupled to the input stage of an operational amplifier. A typical embodiment of such an input stage is shown in FIG. 5a. A differential transistor pair MP1 and MP2 receive the signals applied to the amplifier's non-inverting input 120 and inverting input 122, respectively, and are biased with a tail current provided by a current source 124. The transistor pair conducts respective currents $I_{MP1}$ and $I_{MP2}$ in response to the signal applied to inputs 120 and 122; the currents are typically coupled to some type of load network such as an active load 126.

Figure 5B:
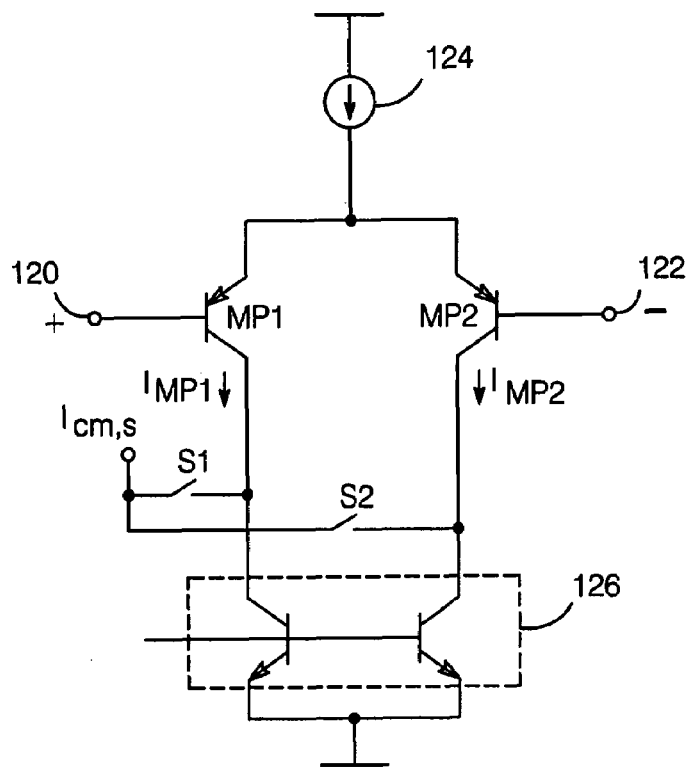
FIG. 5b is a schematic diagram illustrating another possible way in which a compensation current as generated by a common mode rejection calibration scheme per the present invention could be coupled to an operational amplifier.

In the simplest configuration, scaled current $I_{cm,s}$ is coupled to one of currents $I_{MP1}$ and $I_{MP2}$; it is connected to $I_{MP1}$ in the exemplary embodiment shown in FIG. 5a. Alternatively, $I_{cm,s}$ could be switchably connected to either $I_{MP1}$ or $I_{MP2}$; this is illustrated in FIG. 5b. Either switch S1 or switch S2 would be closed as needed to reduce the common-mode error. In practice, current $I_{cm,s}$ would typically be adjusted during the testing of the part: the difference amplifier's CMRR is measured, and the digital value provided to DAC 102 is adjusted until $I_{cm,s}$ reaches a value that cancels out the common-mode error. One possible alternative would be to include an on-chip circuit which would perform the calibration.

When second current $I_{2,s}$ is needed to cancel the common-mode error, it would typically be coupled to one current of the differential transistor pair, with $I_{cm,s}$ coupled to the other pair current. In this case, both DACs 102 and 112 would be adjusted as needed to cancel out the common-mode error. One possible arrangement is shown in FIG. 6a.

Figure 6B:
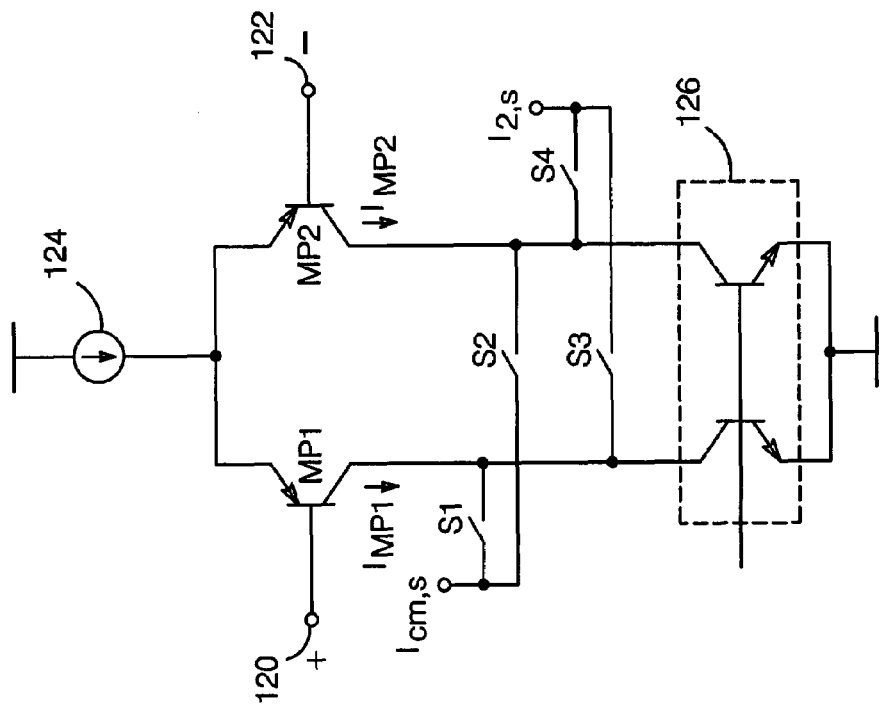
FIG. 6b is a schematic diagram illustrating another possible way in which compensation currents as generated by a common mode rejection calibration scheme per the present invention could be coupled to an operational amplifier.

Alternatively, $I_{cm,s}$ and $I_{2,s}$ could be switchably connected to either $I_{MP1}$ or $I_{MP2}$ as needed to cancel the common-mode error; this is illustrated in FIG. 6b. Here, switches S1 and S4 would be closed together with S2 and S3 open, or S2 and S3 would be closed while S1 and S4 were open.

Figure 6A:
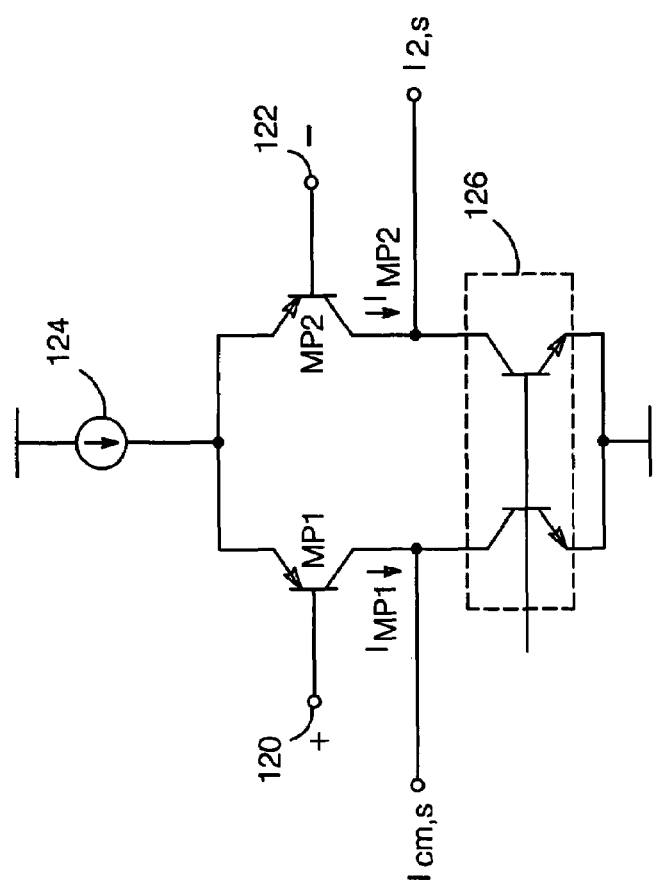
FIG. 6a is a schematic diagram illustrating another possible way in which compensation currents as generated by a common mode rejection calibration scheme per the present invention could be coupled to an operational amplifier.

When arranged as shown in FIG. 6a, currents $I_{cm,s}$ and $I_{2,s}$ produce an output-referred compensation voltage $V_{comp}$ given by:

$$V_{comp} = (I_{cm,s} - I_2) * \frac{1}{gm} * \left( 1 + \frac{R2}{R1} \right) * SF.$$

The gm of the amplifier's input stage is ideally set up to have a temperature coefficient of close to zero. When so arranged, compensation voltage $V_{comp}$ is given by:

$$V_{comp} = \frac{(V_{IP} + V_{IN})}{2} * \frac{R6}{R5 + R6} * \frac{1}{R7} * \frac{1}{gm} * \left( 1 + \frac{R2}{R1} \right) * SF$$

Figure 6D:
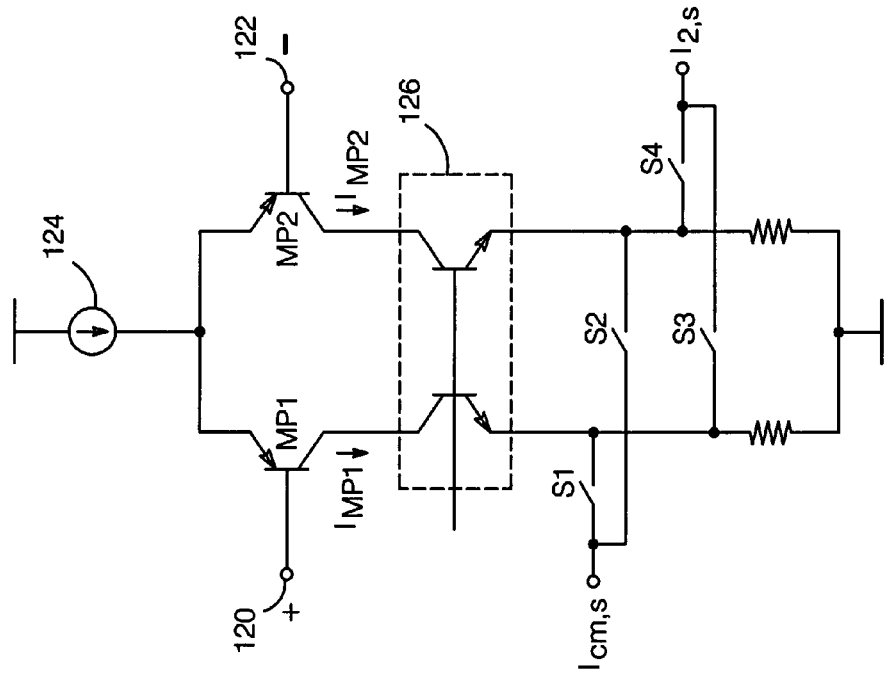
FIG. 6d is a schematic diagram illustrating another possible way in which compensation currents as generated by a common mode rejection calibration scheme per the present invention could be coupled to an operational amplifier.
Figure 6C:
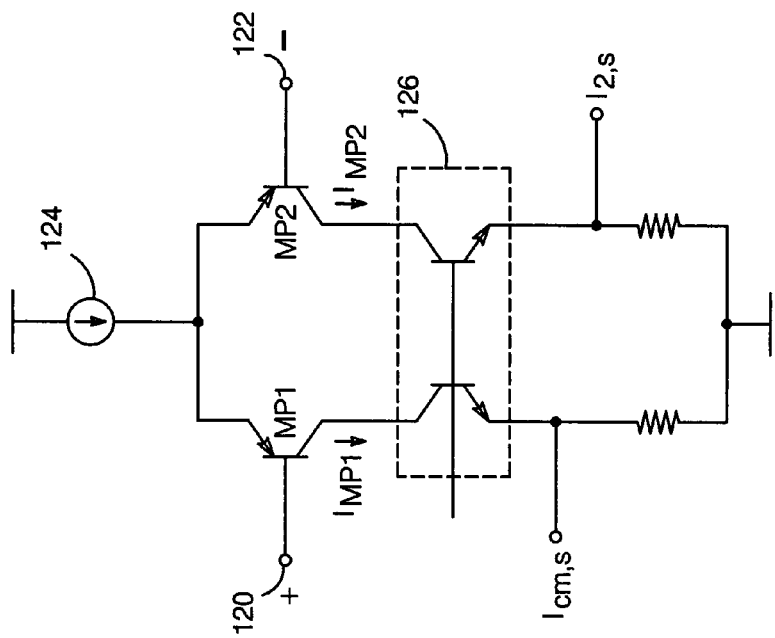
FIG. 6c is a schematic diagram illustrating another possible way in which compensation currents as generated by a common mode rejection calibration scheme per the present invention could be coupled to an operational amplifier.

Compensation currents $I_{cm,s}$ and $I_{2,s}$ can alternatively be coupled into the amplifier's signal path at nodes below the active load. One example is shown in FIG. 6c, and an embodiment which allows $I_{cm,s}$ and $I_{2,s}$ to be switched into the signal path as needed is shown in FIG. 6d. Here, switches S1 and S4 would be closed together with S2 and S3 open, or S2 and S3 would be closed while S1 and S4 were open.

Figure 7:
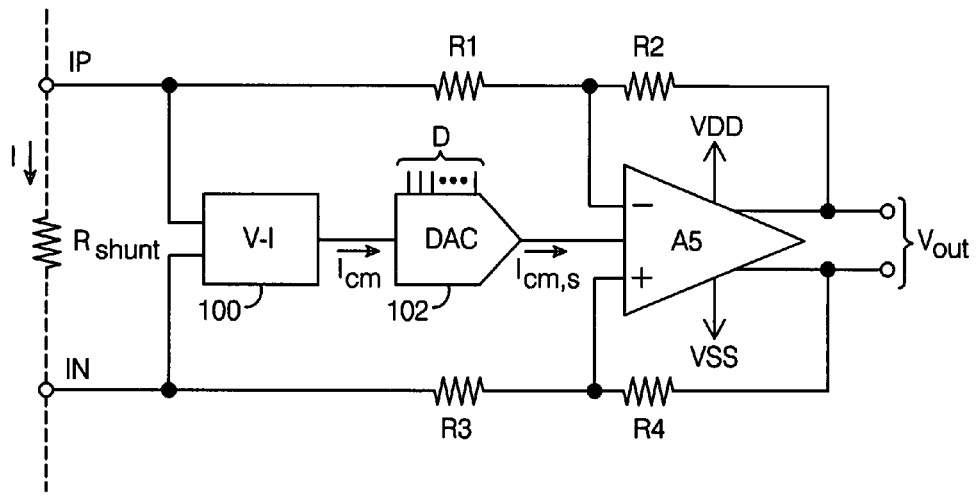
FIG. 7 is a block/schematic diagram illustrating the use of a common mode rejection calibration scheme per the present invention with an operational amplifier having differential inputs and differential outputs.

The present common mode rejection calibration scheme can be employed with difference amplifiers having either a single-ended output, as shown in FIG. 2, or differential outputs. The latter case is illustrated in FIG. 7, which employs a fully differential operational amplifier A5.

Figure 8:
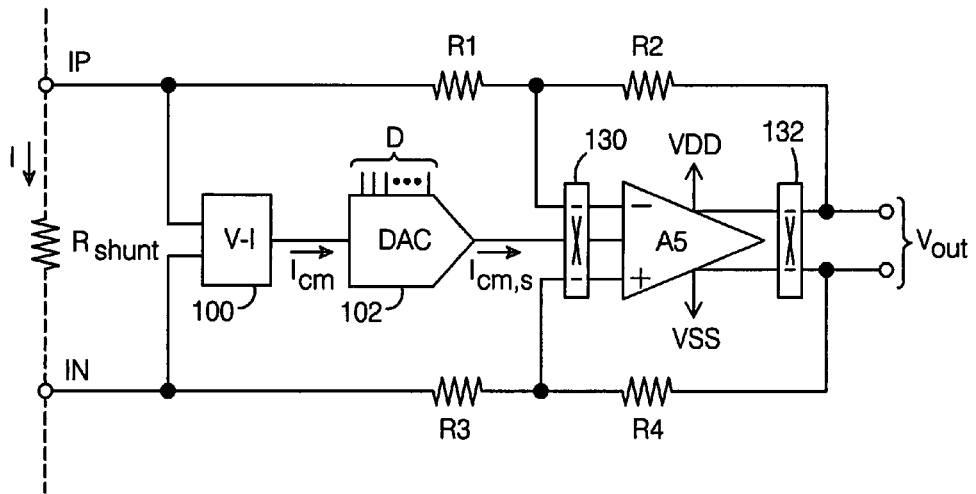
FIG. 8 is a block/schematic diagram illustrating the use of a common mode rejection calibration scheme per the present invention with a chopper-stabilized operational amplifier having differential inputs and differential outputs.
Figure 9:
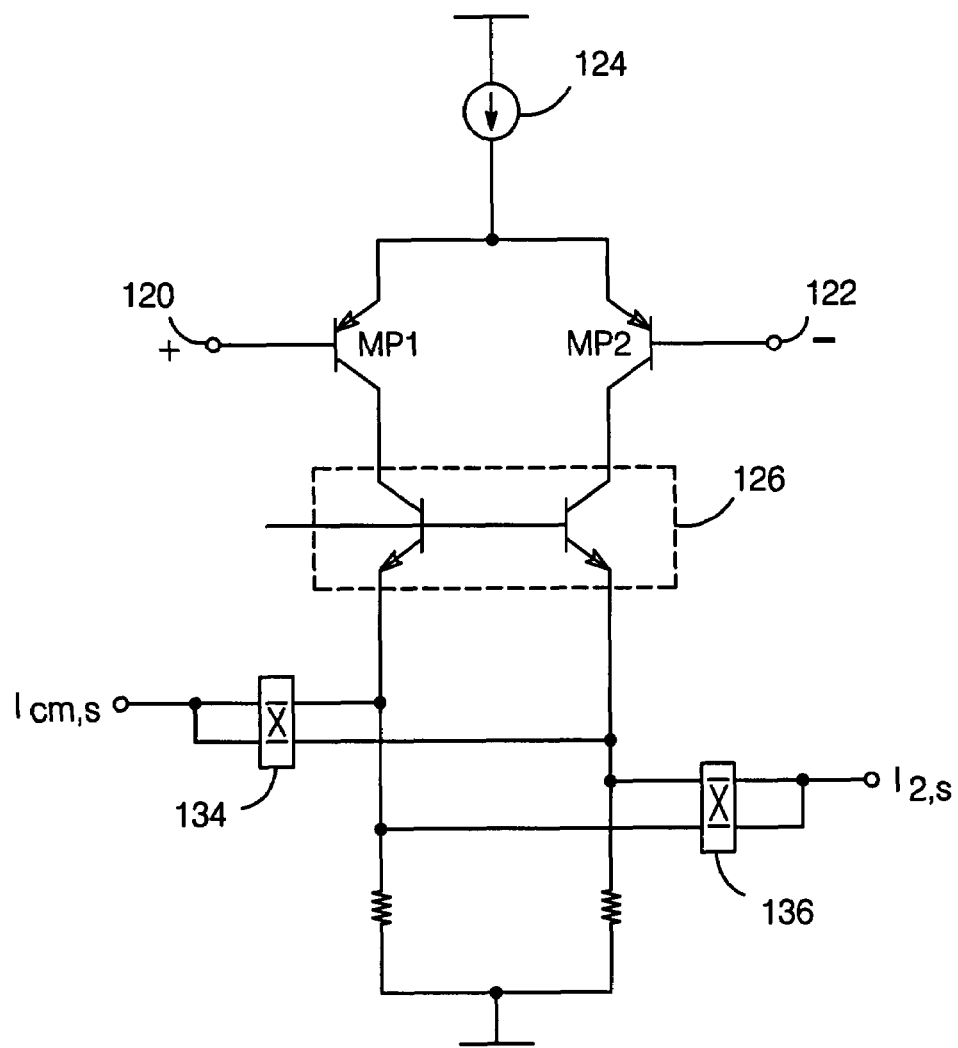
FIG. 9 is a schematic diagram illustrating how the compensation currents coupled to the operational amplifier of FIG. 8 would also be chopped.

The present common mode rejection calibration scheme can also be employed with a chopper-stabilized difference amplifier. This is illustrated in FIG. 8, in which both the inputs to and the outputs from operational amplifier A5 are chopped with chopping switches 130 and 132, respectively. In this case, the compensation currents must also be chopped, as shown in FIG. 9, so that the common mode calibration signal is maintained while the offset of the amplifier is removed. Here, currents $I_{cm,s}$ and $I_{2,s}$ are chopped with chopping switches 134 and 136, respectively, typically in synchronization with the chopping of the operational amplifier's inputs and outputs, as shown in FIG. 8.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A method of improving the common mode rejection of a difference amplifier having differential inputs, an output, and an associated signal path, comprising:
   converting the common mode voltage of a differential voltage applied to said differential inputs to a single current;
   providing an adjustable scaling means which scales said single current; and
   coupling said single scaled current into said signal path;
   wherein said difference amplifier includes a differential transistor pair which conducts respective currents in response to said applied differential voltage, said single scaled current coupled to one of the currents conducted by said differential transistor pair such that said single scaled current reduces the common-mode error that would otherwise be present in the difference amplifier's output.

2. A method of improving the common mode rejection of a difference amplifier having differential inputs, an output, and an associated signal path, comprising:
   generating a signal which varies with the common mode voltage of a differential voltage applied to said differential inputs;
   scaling said generated signal; and
   coupling said scaled signal into said signal path such that said scaled signal reduces the common-mode error that would otherwise be present in the difference amplifier's output;
   wherein said scaled signal is a scaled current and said difference amplifier includes a differential transistor pair which conducts respective currents in response to said applied differential voltage, said scaled current coupled to one of the currents conducted by said differential transistor pair such that said scaled current reduces the common-mode error that would otherwise be present in the difference amplifier's output, and
   wherein said difference amplifier is chopper-stabilized, further comprising chopping said scaled current between the currents conducted by said differential transistor pair in synchronization with said chopper stabilization.

3. The method of claim 1, further comprising:
   generating a second current; and
   coupling said second current to the other of said currents conducted by said differential transistor pair, such that said single scaled current and said second current reduce the common-mode error that would otherwise be present in the difference amplifier's output.

4. A method of improving the common mode rejection of a difference amplifier having differential inputs, an output, and an associated signal path, comprising:
   generating a signal which varies with the common mode voltage of a differential voltage applied to said differential inputs;
   scaling said generated signal;
   generating a second current;
   wherein said scaled signal is a scaled current and said difference amplifier includes a differential transistor pair which conducts respective currents in response to said applied differential voltage, said scaled current coupled to one of the currents conducted by said differential transistor pair; and
   coupling said second current to the other of said currents conducted by said differential transistor pair, such that said scaled current and said second current reduce the common-mode error that would otherwise be present in the difference amplifier's output;
   wherein said difference amplifier is chopper-stabilized, further comprising chopping said scaled and second currents between the currents conducted by said differential transistor pair in synchronization with said chopper stabilization.

5. The method of claim 3, further comprising:
   scaling said second current; and
   coupling said scaled second current to the other of said currents conducted by said differential transistor pair, such that said single scaled current and said scaled second current reduce the common-mode error that would otherwise be present in the difference amplifier's output.

6. A method of improving the common mode rejection of a difference amplifier having differential inputs, an output, and an associated signal path, comprising:
   generating a signal which varies with the common mode voltage of a differential voltage applied to said differential inputs;
   scaling said generated signal; and
   coupling said scaled signal into said signal path such that said scaled signal reduces the common-mode error that would otherwise be present in the difference amplifier's output;
   wherein said applied differential voltage is the voltage developed across a shunt resistor which carries a current of interest.

7. A common mode rejection calibration system for a difference amplifier having differential inputs and an output, comprising:
   a first circuit arranged to generate a single current $I_{cm}$ which varies with the common mode voltage of a differential voltage applied to the inputs of said difference amplifier;
   a first adjustable scaling circuit which receives said single current $I_{cm}$ at an input and provides a single scaled current $I_{cm,s}$ at an output; and
   an operational amplifier having an input stage comprising a differential transistor pair which conducts respective currents in response to said applied differential voltage, said single scaled current $I_{cm,s}$ coupled to one of the currents conducted by said differential transistor pair, such that said single scaled current reduces the common-mode error that would otherwise be present in the difference amplifier's output;
   wherein said first circuit comprises a voltage-to-current converter which receives said differential voltage at an input and generates said single current $I_{cm}$ at an output.

8. A common mode rejection calibration system for a difference amplifier having differential inputs and an output, comprising:

a first circuit arranged to generate a current $I_{cm}$ which varies with the common mode voltage of a differential voltage applied to the inputs of said difference amplifier;

a first scaling circuit which receives said current $I_{cm}$ at an input and provides a scaled current $I_{cm,s}$ at an output; and an operational amplifier having an input stage comprising a differential transistor pair which conducts respective currents in response to said applied differential voltage, said scaled current $I_{cm,s}$ coupled to one of the currents conducted by said differential transistor pair, such that said scaled current reduces the common-mode error that would otherwise be present in the difference amplifier's output;

wherein said first scaling circuit is a digital-to-analog converter (DAC) which receives said current $I_{cm}$ at a reference input, scales said current $I_{cm}$ in response to a digital value received at its digital input, and provides said scaled current $I_{cm,s}$ at its analog output.

9. The common mode rejection calibration system of claim 8, further comprising a shunt resistor which carries a current of interest, the voltage across said shunt resistor being said applied differential voltage.

10. A common mode rejection calibration system for a difference amplifier having differential inputs and an output, comprising:

a first circuit arranged to generate a current $I_{cm}$ which varies with the common mode voltage of a differential voltage applied to the inputs of said difference amplifier;

a first scaling circuit which receives said current $I_{cm}$ at an input and provides a scaled current $I_{cm,s}$ at an output; and an operational amplifier having an input stage comprising a differential transistor pair which conducts respective currents in response to said applied differential voltage, said scaled current $I_{cm,s}$ coupled to one of the currents conducted by said differential transistor pair, such that said scaled current reduces the common-mode error that would otherwise be present in the difference amplifier's output;

wherein said first circuit comprises:

a first voltage divider connected between one leg of said differential voltage and a circuit return point; and a first transistor connected between a first node and said circuit return point, said first circuit arranged such that said first transistor conducts a first current in response to the voltage at the output of said first voltage divider; and a second voltage divider connected between the other leg of said differential voltage and said circuit return point; and a second transistor connected between said first node and said circuit return point, said first circuit arranged such that said second transistor conducts a second current in response to the voltage at the output of said second voltage divider, said first and second currents summed to form current $I_{cm}$ at said first node.

11. The common mode rejection calibration system of claim 10, wherein said voltage dividers comprise respective resistor networks, the resistances of said resistors selected to provide an $I_{cm}$ value which reduces the common-mode error that would otherwise be present in the difference amplifier's output, such that $I_{cm,s}=I_{cm}$.

12. A common mode rejection calibration system for a difference amplifier having differential inputs and an output, comprising:

a first circuit arranged to generate a current $I_{cm}$ which varies with the common mode voltage of a differential voltage applied to the inputs of said difference amplifier;

a first scaling circuit which receives said current $I_{cm}$ at an input and provides a scaled current $I_{cm,s}$ at an output; and an operational amplifier having an input stage comprising a differential transistor pair which conducts respective currents in response to said applied differential voltage, said scaled current $I_{cm,s}$ coupled to one of the currents conducted by said differential transistor pair, such that said scaled current reduces the common-mode error that would otherwise be present in the difference amplifier's output;

further comprising a switching means arranged such that said scaled current $I_{cm,s}$ can be coupled to one or the other of said currents conducted by said differential transistor pair.

13. The common mode rejection calibration system of claim 7, wherein said operational amplifier has differential inputs and differential outputs.

14. A common mode rejection calibration system for a difference amplifier having differential inputs and an output, comprising:

a first circuit arranged to generate a current $I_{cm}$ which varies with the common mode voltage of a differential voltage applied to the inputs of said difference amplifier;

a first scaling circuit which receives said current $I_{cm}$ at an input and provides a scaled current $I_{cm,s}$ at an output; and an operational amplifier having an input stage comprising a differential transistor pair which conducts respective currents in response to said applied differential voltage, said scaled current $I_{cm,s}$ coupled to one of the currents conducted by said differential transistor pair, such that said scaled current reduces the common-mode error that would otherwise be present in the difference amplifier's output;

wherein said operational amplifier has differential inputs and differential outputs; and wherein said difference amplifier is chopper-stabilized.

15. The common mode rejection calibration system of claim 14, wherein said scaled current $I_{cm,s}$ is chopped between the currents conducted by said differential transistor pair in synchronization with said chopper stabilization.

16. A common mode rejection calibration system for a difference amplifier having differential inputs and an output, comprising:

a first circuit arranged to generate a current $I_{cm}$ which varies with the common mode voltage of a differential voltage applied to the inputs of said difference amplifier;

a first scaling circuit which receives said current $I_{cm}$ at an input and provides a scaled current $I_{cm,s}$ at an output; and an operational amplifier having an input stage comprising a differential transistor pair which conducts respective currents in response to said applied differential voltage, said scaled current $I_{cm,s}$ coupled to one of the currents conducted by said differential transistor pair, such that said scaled current reduces the common-mode error that would otherwise be present in the difference amplifier's output;

further comprising:

a second circuit arranged to generate a current $I_2$; and a second scaling circuit which receives said current $I_2$ at an input and provides a scaled current $I_{2,s}$ at an output, said scaled current $I_{cm,s}$ coupled to one of the currents conducted by said differential transistor pair and said scaled current $I_{2,s}$ coupled to the other current conducted by said differential transistor pair, such that said scaled currents reduce the common-mode error that would otherwise be present in the difference amplifier's output.

17. The common mode rejection calibration system of claim 16, wherein said second scaling circuit is a digital-to-analog converter (DAC) which receives said current $I_2$ at a reference input, scales said current $I_2$ in response to a digital value received at its digital input, and provides said scaled current $I_{2,s}$ at an output.

18. The common mode rejection calibration system of claim 16, further comprising a switching means arranged such that each of said scaled currents $I_{cm,s}$ and $I_{2,s}$ can be coupled to one or the other of said currents conducted by said differential transistor pair.

19. A common mode rejection calibration system for a difference amplifier having differential inputs and an output, comprising:
   a first circuit arranged to generate a current $I_{cm}$ which varies with the common mode voltage of a differential voltage applied to the inputs of said difference amplifier;
   a first scaling circuit which receives said current $I_{cm}$ at an input and provides a scaled current $I_{cm,s}$ at an output; and
   an operational amplifier having an input stage comprising a differential transistor pair which conducts respective currents in response to said applied differential voltage, said scaled current $I_{cm,s}$ coupled to one of the currents conducted by said differential transistor pair, such that said scaled current reduces the common-mode error that would otherwise be present in the difference amplifier's output;
   wherein said operational amplifier has non-inverting and inverting inputs and an output, further comprising:
      a first resistor having a resistance R1 connected between one of said differential inputs and said inverting input;
      a second resistor having a resistance R2 connected between said inverting input and said output;
      a third resistor having a resistance R3 connected between the other of said differential inputs and said non-inverting input; and
      a fourth resistor having a resistance R4 connected between said non-inverting input and a circuit common point, such that the common-mode error $V_{cmout}$ at the output of said difference amplifier is given by:

$$V_{cmout} = \frac{V1+V2}{2} * \left[\frac{\frac{R1}{R1+R2} + \frac{R4}{R3+R4}}{\frac{R4}{R3+R4} - \frac{R4}{R2+R1}}\right] * \frac{R2}{R1} * \frac{1}{2},$$

where V1 and V2 are the voltages at said first and second input nodes, respectively,
   said common mode rejection calibration system arranged such that said scaled current $I_{cm,s}$ is approximately given by:

$$I_{cm,s} = -\frac{\frac{V1+V2}{2} * \left[\frac{\frac{R1}{R1+R2} + \frac{R4}{R3+R4}}{\frac{R4}{R3+R4} - \frac{R4}{R2+R1}}\right] * \frac{R2}{R1} * \frac{1}{2}}{gm},$$

where gm is the transconductance of said operational amplifier's input stage.

* * * * *